(12) United States Patent
Nara

(10) Patent No.: US 7,463,180 B2
(45) Date of Patent: Dec. 9, 2008

(54) ANALOG TO DIGITAL CONVERSION APPARATUS

(75) Inventor: Akira Nara, Kodaira (JP)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/844,291

(22) Filed: Aug. 23, 2007

(65) Prior Publication Data

US 2008/0143575 A1    Jun. 19, 2008

(30) Foreign Application Priority Data

Aug. 23, 2006    (JP) ............................. 2006-226842

(51) Int. Cl.
*H03M 1/12* (2006.01)
(52) U.S. Cl. .................... 341/155; 341/120; 341/139
(58) Field of Classification Search ............ 341/139, 341/155
See application file for complete search history.

(56) References Cited

U.S. PATENT DOCUMENTS

| 6,407,691 | B1 * | 6/2002 | Yu .............................. 341/155 |
| 6,741,847 | B1 * | 5/2004 | Claxton et al. .............. 455/306 |
| 6,933,874 | B2 * | 8/2005 | Pentakota ................... 341/154 |
| 7,129,872 | B1 * | 10/2006 | Qvortrup et al. ............ 341/139 |

* cited by examiner

*Primary Examiner*—Khai M Nguyen
(74) *Attorney, Agent, or Firm*—Matthew D. Rabdau

(57) ABSTRACT

An up-converter 124 frequency-up-converts an analog signal Sm. A down-converter 121 frequency-down-converts analog signal Sm. A signal selection block 125 selects one of the frequency-up-converted signal Sfu and frequency-down-converted signal Sfd. The signal Se selected by the signal selection block 125 is provided to the primary winding of a transformer 127. A signal induced in the secondary winding of the transformer 127 is provided to an A/D converter 128 to produce a digital signal Dm. For example, if the analog signal Sm has DC or a low frequency close to DC, the signal Sfu is selected as the signal Se. If the analog signal Sm does no have DC nor a low frequency close to DC, the signal Sfd is selected as the signal Se.

8 Claims, 4 Drawing Sheets

A/D CONVERSION APPARATUS

CONVENTIONAL A/D CONVERSION APPARATUS

SIGNAL ANALYZER

ANALOG TO DIGITAL CONVERSION APPARATUS

This application claims priority from Japanese Patent Application No. 2006-226842 filed on Aug. 23, 2006.

BACKGROUND

The present invention relates to an A/D conversion apparatus that can precisely convert an analog signal to a digital signal.

An A/D conversion apparatus converts an input analog signal to a digital signal as an output and uses a fast and precise A/D converter. The A/D conversion apparatus may use a transformer as a drive circuit to provide the analog signal to the A/D converter to make full use of the precise characteristics of the A/D converter. Relative to use of an amplifier, the use of the transformer as described above allows converting precisely an analog signal to a digital signal because it is not affected by non-linearity and/or circuit noise of the amplifier and then the analog signal is provided to the A/D converter without distortion. Besides, the use of the transformer allows providing the A/D converter with the analog signal as a differential signal, which reduces influence of higher harmonic wave, common mode noise, etc.

In the case of providing an analog signal to an A/D converter via a transformer, if the analog signal is getting closer to DC or a low frequency close to DC, it cannot provide the analog signal to the A/D converter via the transformer without distortion. Therefore, wideband analog to digital conversion requires a DC coupled drive circuit as well as the AC coupled drive circuit using the transformer.

FIG. 1 is a block diagram of a conventional A/D conversion apparatus that has AC and DC coupled drive circuits. An input analog signal is properly adjusted by an attenuator (not shown) and provided to a down-converter 51 of the A/D conversion apparatus 50 as an analog signal Sm. The analog signal Sm is also provided to a low bandpass filter 55 through a buffer amplifier 54.

The down-converter 51 multiplies the analog signal Sm and a local signal Sla to conduct frequency down conversion and provides an analog signal Sfd after the frequency conversion to one terminal of the primary winding of the transformer 53 via a gain block 52. The other terminal of the primary winding is grounded and the secondary winding is coupled to fixed terminals PTa1 and PTa2 of a signal selection switch 58.

The low bandpass filter 55 filters the analog signal Sm provided via the buffer amplifier 54 to remove an unnecessary high band component and provides the filtered analog signal Sfp to a differential amplifier 57 via a gain block 56.

The differential amplifier 57 amplifies the filtered analog signal Sfp and provides it to fixed terminals PTb1 and PTb2 of the signal selection switch 58.

The signal selection switch 58 has movable terminals PTs1 and PTs2 that are coupled to differential inputs of an A/D converter 60. A sampling clock generator 59 provides a sampling clock signal Ssp to the A/D converter 60.

The signal selection switch 58 selects one of the analog signals that are provided from the transformer 53 and the differential amplifier 57, and provides the selected analog signal to the A/D converter 60. Wherein if a semiconductor switch is used as the signal selection switch 58, there is a possibility that the analog signal will have distortion because the level of the provided analog signal may be too large as the analog signal provided to the signal selection switch 58 is amplified suitable for an input level of the A/D converter 60. Therefore mechanical relays that mechanically switch contacts are used as the signal selection switch 58 to avoid the distortion in the analog signal provided to the A/D converter 60.

In the A/D conversion apparatus 50 having configuration as described above, if the input analog signal is neither DC nor low frequency close to DC, the signal selection switch 58 switches the movable terminals PTs1 and PTs2 to the fixed terminals PTa1 and PTa2 respectively to provide the A/D converter 60 with the analog signal induced in the secondary winding of the transformer 53. This allows providing the A/D converter 60 with the analog signal without distortion so that the input analog signal is precisely converted to a digital signal. On the other hand, if the input analog signal is DC or low frequencies close to DC, the signal selection switch 58 switches the movable terminals PTs1 and PTs2 to the fixed terminals PTb1 and PTb2 respectively to provide the A/D converter 60 with the analog signal provided from the differential amplifier 57. Therefore, even the input analog signal is DC or the low frequencies close to DC it provides the digital signal according to the input analog signal.

But there is a possibility that the A/D conversion apparatus 50 shown in FIG. 1 may not provide the analog signal to the A/D converter 60 because repetitive signal switching leads to degradation of the contacts since it uses the mechanical relays as the signal selection switch not to distort the analog signal. Besides, it can not realize fast signal switching.

Then, not to use the mechanical relays, an A/D conversion apparatus 70 shown in FIG. 2 has AC-coupled and DC-coupled drive circuits that have the respective A/D converters 71 and 72. Note that blocks in FIG. 2 corresponding to those in FIG. 1 are labeled the same.

If the AC-coupled and DC-coupled drive circuits have the respective A/D converters as describe, it solves problems on the contact degradation and the signal switching time, etc. But use of a plurality of A/D converters leads to high cost of the A/D conversion apparatus 70.

Besides, in case of using the differential amplifier 57 as shown in FIGS. 1 and 2, the distortion characteristics of the differential amplifier 57 is worse than those of a transformer. Therefore, even if a high-precision A/D converter is used, accuracy of the analog to digital conversion is determined by characteristics of the differential amplifier 57 and then it cannot convert the analog signal to digital signal with high precision.

SUMMARY

Accordingly, an embodiment of the present invention provides an A/D conversion apparatus that can convert an input analog signal to a digital signal with high precision even if frequency of the analog signal is low.

An embodiment of an A/D conversion apparatus according to the present invention has an A/D converter conducting analog to digital conversion, a low bandpass filter for limiting a band of an input analog signal as satisfying a Nyquist condition defined by a sampling frequency of the A/D converter, an up-converter for conducting frequency-up-conversion of an output signal of the low bandpass filter, and a transformer receiving an output signal of the up-converter at the primary winding and for providing the A/D converter with an analog signal induced in the secondary winding wherein the frequency-up-conversion is conducted as an alias (digital signal) arises at the A/D converter corresponds to the output signal of the low bandpass filter.

In other words, after frequency-up-converting DC and/or a low frequency component of an input analog signal and putting it through a transformer, embodiments of the present invention conduct frequency conversion using the alias that is intentionally brought with the A/D converter to obtain the digital signal corresponding to the output signal of the low bandpass filter from the A/D converter as a result. Accordingly, even if frequencies of an input analog signal are low, the A/D conversion apparatus can converts it to a digital signal with high precision.

The A/D conversion apparatus according to embodiments of the present invention may further include a down-converter for frequency-down-converting the input analog signal and a signal selection block for selecting one of the output signals of the up-converter and down-converter to provide it to the transformer. This realizes an A/D conversion apparatus that features wideband up to a high frequency and little distortion in addition to converting the analog signal of a low frequency into the digital signal with high precision. Though the output signals of the up-converter and down-converter correspond to the low frequency signal component (including DC) and high frequency signal component respectively, the signal selection block receiving them can be arranged before the transformer. Then, a semiconductor switch becomes available as the signal selection block in place of mechanical relays because the signal received by the signal selection block is a signal before amplification as adjusted for an input level of the A/D converter and does not include a DC component. This dramatically improves durability, reliability, and responsiveness of the signal selection block. Besides, the gain block for adjusting the output gain of the transformer can be commonly used for both of low and high frequency components, which reduces manufacturing cost.

In an embodiment of the A/D conversion apparatus, the up-converter may conduct the up-conversion by multiplying the input analog signal by a local signal with a frequency that is the same as the sampling frequency of the A/D converter. This allows the alias arising at the A/D converter to correspond to the output signal of the low bandpass filter.

The objects, advantages and other novel features of the present invention are apparent from the following detailed description when read in conjunction with the appended claims and attached drawing views.

DETAILED DESCRIPTION

Figure 1:
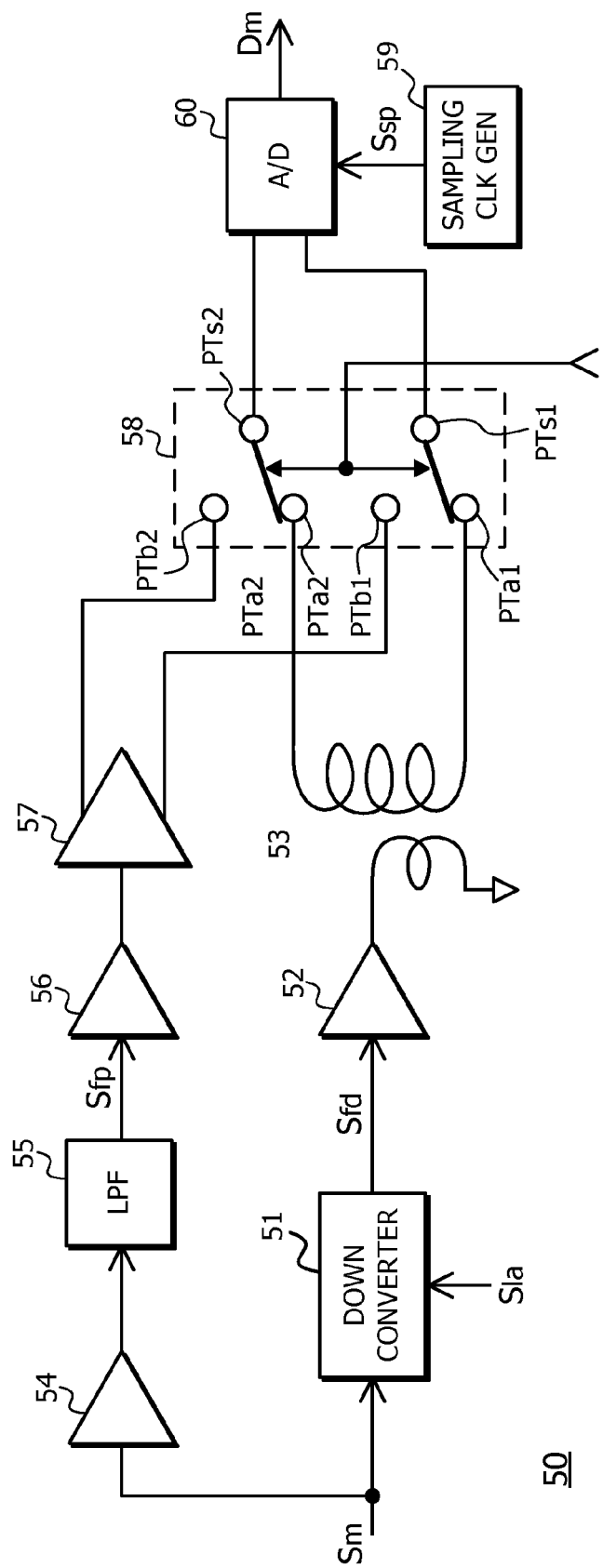
FIG. 1 illustrates a block diagram of a conventional A/D conversion apparatus.
Figure 2:
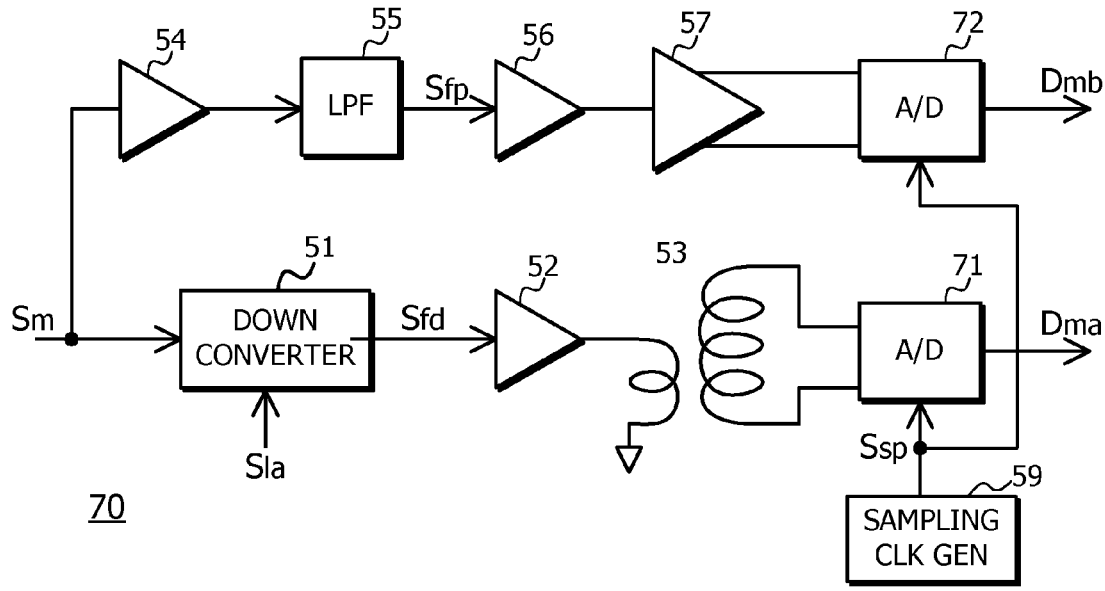
FIG. 2 illustrates a block diagram of a conventional A/D conversion apparatus.
Figure 3:
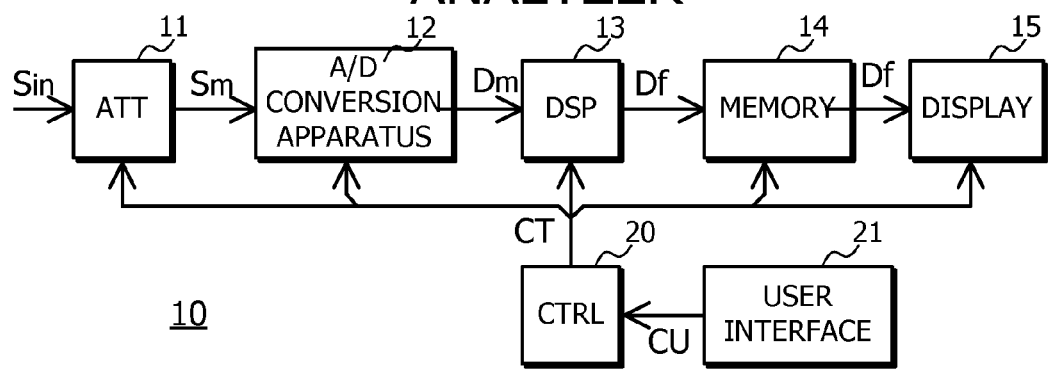
FIG. 3 illustrates a block diagram of a signal analyzer.

Hereinafter, an embodiment of the present invention is described referring to figures. FIG. 3 is a block diagram of a signal analyzer using an A/D conversion apparatus according to an embodiment of the present invention. The signal analyzer is an apparatus that can analyze a signal under test from view points of both time and frequency domains.

An analog signal Sin is provided to an attenuator 11 of the signal analyzer 10 as a signal under test. The attenuator 11 adjusts the analog signal Sin properly and provides it to an A/D conversion apparatus 12. Because of the attenuator 11, the signal analyzer 10 can analyze the analog signal Sin even if its level is large. The A/D conversion apparatus 12 converts an analog signal Sm that is an input analog signal through the attenuator 11 into a digital signal Dm and provides it to a digital signal processor 13. The digital signal processor 13 digitally down converts the digital signal Dm of time domain according to user-set center frequency and frequency span and then conducts Fourier transform to produce a digital signal Df of a frequency domain to be stored in a memory block 14. A display block 15 displays spectrum, etc. of the signal under test using the digital signal Df stored in the memory block 14.

A control block 20 is coupled to a user interface block 21. The user interface block 21 has operation switch, operation panel, etc. If a user operates the operation switch, operation panel, etc., the interface block 21 generates an operation signal CU that indicates the user operation and/or setting status set by the user and provide it to the control block 20. The control block 20 provides control signals CT based on the operation signal CU to the respective blocks to control the operation of the signal analyzer 10 as it operates according to the user operation and/or settings.

Figure 4:
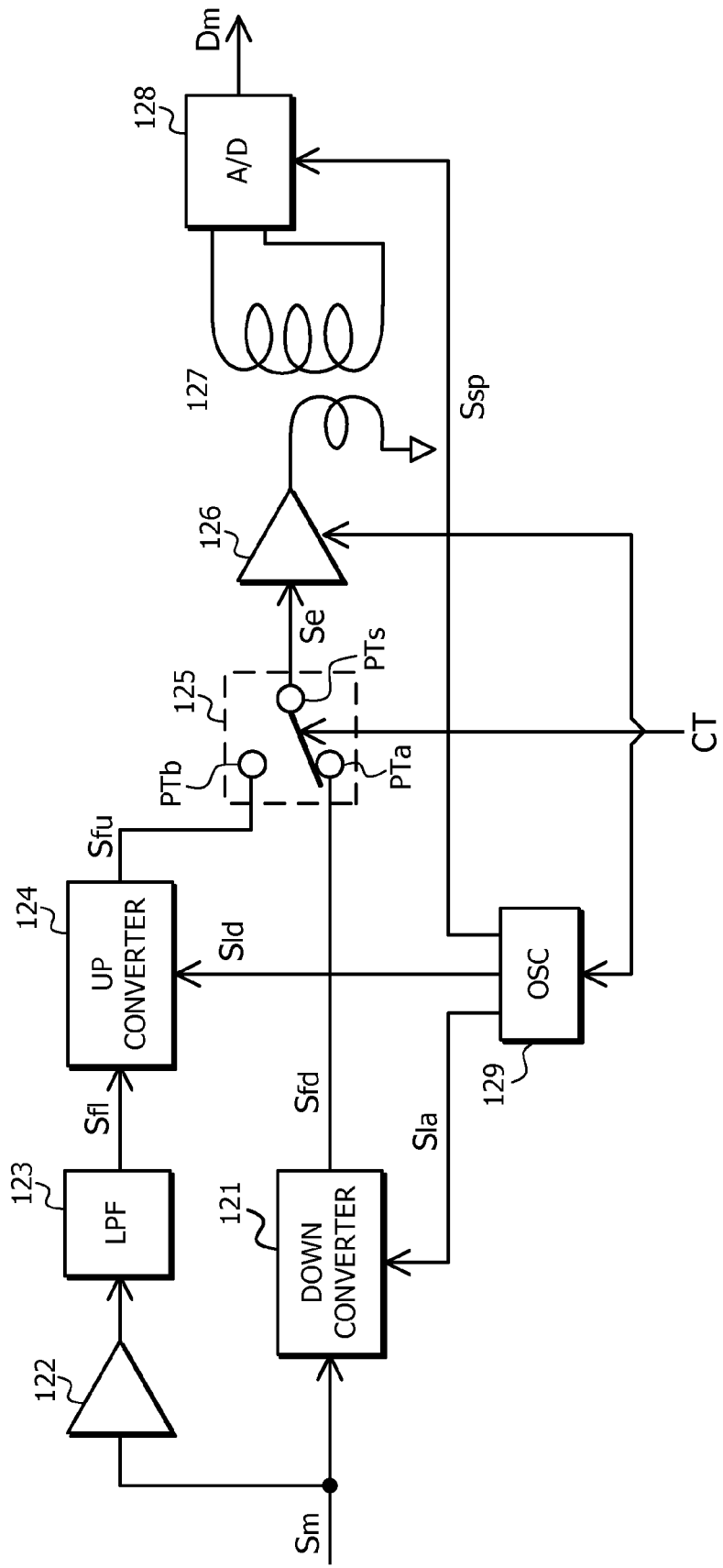
FIG. 4 illustrates a block diagram of an A/D conversion apparatus.

FIG. 4 is a block diagram of the A/D conversion apparatus 12. The analog signal Sm from the attenuator 11 is provided to a down-converter 121 of the A/D conversion apparatus 12. The analog signal Sm is also provided to a low bandpass filter 123 via a buffer amplifier 122.

The down-converter 121 down converts the analog signal Sm by multiplying it with a local signal Sla provided from an oscillator 129 described below and provides an analog signal Sfd, or a frequency down converted signal, to a fixed terminal PTa of a signal selection block 125.

Figure 5:
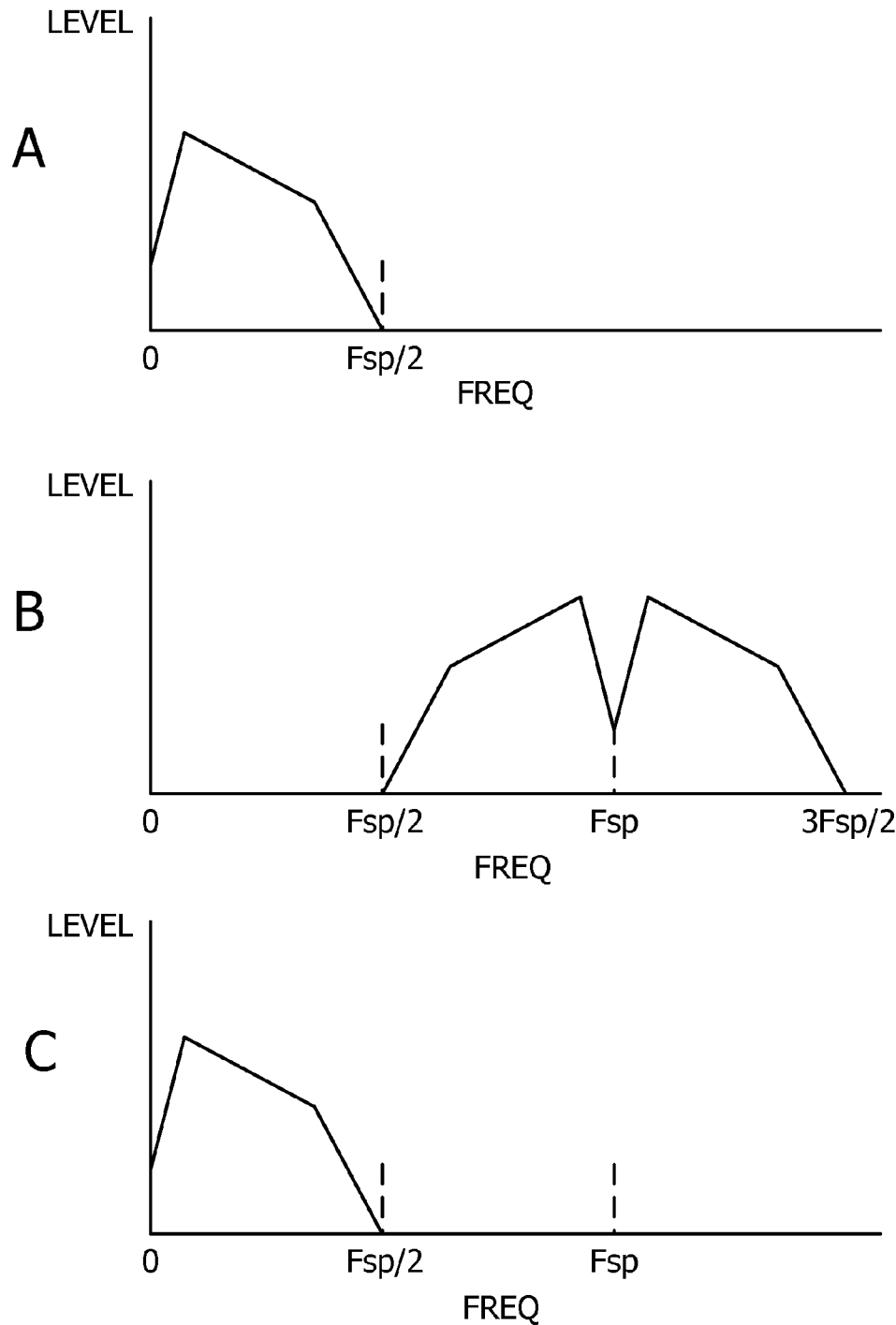
FIG. 5 illustrates operation when an input signal has DC or a low frequency close to DC.

The low bandpass filter 123 limits a band of the analog signal Sm provided through the buffer amplifier 122 and provides a band-limited analog signal Sfl to an up-converter 124. The low bandpass filter 123 removes high frequencies over a half of a sampling frequency Fsp of an A/D converter 128 according to the Nyquist condition defined by the sampling frequency Fsp as shown in FIG. 5A to produce a proper digital signal when the low frequency component passed through the low bandpass filter 123 is converted with an A/D converter.

The up-converter 124 frequency-up-converts the analog signal Sfl by multiplying it with a local signal Sld provided from the oscillator 129 and provides the frequency-up-converted signal, or an analog signal Sfu to a fixed terminal PTb of the signal selection block 125.

The signal selection block 125 switches a movable terminal PTs to one of the fixed terminals PTa and PTb according to the control signal CT. The switching of the movable terminal PTs allows selecting one of the frequency-down-converted analog signal Sfd or frequency-up-converted analog signal Sfu to provide the selected one as an analog signal Se to a gain block (amplifier) 126.

The gain block 126 amplifies the analog signal Se at a predetermined gain and provides it to one terminal of the primary winding of a transformer 127. The other terminal of the primary winding is grounded and the secondary winding is coupled to input terminals of an A/D converter 128. Therefore, an analog signal induced in the secondary winding is provided to the A/D converter 128 as a differential signal Sg.

A sampling clock signal Ssp is provided to the A/D converter 128 from the oscillator 129. The A/D converter 128 samples the differential signal Sg provided from the transformer 127 according to the sampling clock signal Ssp and digitizes the sampled signal to produce a digital signal Dm.

The oscillator 129 provides the sampling clock signal Ssp to the A/D converter 128. In addition, the oscillator 129 provides the local signal Sld with a frequency that is the same as that of the sampling clock signal Ssp to the up-converter 124. Further, the oscillator 129 provides the local signal Sla to the down-converter 121.

Operation of the A/D conversion apparatus is described below. In case of converting an analog signal of which frequency is not DC nor a low frequency close to DC, or when a frequency band measured by the signal analyzer 10 is not DC nor a low frequency close to DC, the movable terminal PTs of the signal selection block 125 is switched to the fixed terminal PTa according to the control signal CT. Then, the analog signal Sfd output from the down-converter 121 is provided to the A/D converter 128 as the analog signal Se. Therefore, the A/D conversion apparatus can convert the signal of which frequency is not DC nor low frequency close to DC to the digital signal Dm with high precision. Use of the digital signal Dm allows precise display of spectrums of the frequency band under measurement.

If a frequency of the local signal Sla is set to make the frequency band under measurement less or equal the Nyquist frequency (a half of the sampling frequency Fsp) of the A/D converter 128 with the down-conversion, the analog signal of the frequencies under measurement are precisely converted to the digital signal. If the frequency of the local signal Sla is changed, the frequency band under measurement can be set as desired. The down-converter 121 has a low bandpass filter (not shown) to remove unnecessary signal components.

Next, in case of converting an analog signal of which frequency is DC or a low frequency close to DC, or when a frequency band measured by the signal analyzer 10 is DC or a low frequency close to DC, the movable terminal PTs of the signal selection block 125 is switched to the fixed terminal PTb according to the control signal CT. Then, the analog signal Sfu output from the up-converter 124 is provided to the A/D converter 128 via the transformer 127. Therefore, the A/D conversion apparatus can precisely convert an analog signal of which frequency is even DC or a low frequency close to DC into the digital signal Dm. Use of this digital signal Dm allows precisely displaying spectrums of the frequency band under measurement.

The local signal Sld with a frequency that is the same as that of the sampling clock signal Ssp of the A/D converter 128 is provided to the up-converter 124. Then, the spectrums of the analog signal Sfu output from the up-converter 124 have a pair of signal components of frequencies from Fsp to Fsp/2 and from Fsp to 3Fsp/2, as shown in FIG. 5B, that are derived by converting a signal component of frequencies from DC to Fsp/2, as shown in FIG. 5A, so that it does not include DC and a low frequency component close to DC. That is, even if the analog signal Sin has DC or a low frequency close to DC, the frequency-up-conversion of the analog signal Sfl by the up-converter 124 allows providing the A/D converter 128 with the analog signal Sfu derived from the analog signal Sin through the transformer 127 without distortion.

The A/D converter 128 A/D-converts the input signal having frequencies that are higher than the half of the sampling frequency Fsp so that the output signal has an alias. But because the frequencies of the sampling clock signal Ssp and local signal Sld are the same, the signal components of the frequencies from Fsp to Fsp/2 and from Fsp to 3Fsp/2 are folded from DC to Fsp/2 as shown in FIG. 5C to be equal to the analog signal Sfl. Therefore, it can provide the digital signal that corresponds to a signal component of the analog signal before the frequency-up-conversion. Conversely, the frequency-up-conversion is conducted as the digital signal generated by the alias at the A/D converter 128 corresponds to the output signal of the low bandpass filter. This can be considered to willingly utilize the frequency conversion by the alias.

Because the signal selection block 125 receives an analog signal that has a small level before amplification of adjusting it for an input level of the A/D converter 128 and does not have DC component, even a semiconductor switch does not distort the analog signal. Then, a semiconductor switch becomes available as the signal selection block 125, which solves the problem of contact degradation relative to using mechanical relays and leads to better reliability. Besides, switching between the analog signals Sfd and Sfu becomes faster.

Because the gain block (amplifier) 126 is provided between the signal selection block 125 and the transformer 127 and then it is commonly used for both of the analog signals having DC and low frequencies, and not. That is, it is not necessary to provide AC-coupled and DC-coupled drive circuits with the respective gain blocks like the conventional A/D conversion apparatus, which further reduces cost of the wideband A/D conversion apparatus.

What is claimed is:

1. An analog to digital conversion apparatus comprising:
   an analog to digital converter;
   a low bandpass filter for limiting a band of an input analog signal as satisfying a Nyquist condition defined by a sampling frequency of the analog to digital converter;
   an up-converter for frequency-up-converting an output signal of the low bandpass filter; and
   a transformer receiving an output of the up-converter at the primary winding and for providing the A/D converter with an analog signal induced at the secondary winding wherein the frequency-up-conversion is conducted as an alias arises at the A/D converter corresponds to the output signal of the low bandpass filter.

2. The analog to digital conversion apparatus as recited in claim 1 further comprising:
   a down-converter for frequency-down-converting the input analog signal; and
   a signal selection block for selecting one of the output signals of the up-converter and down-converter to provide it to the transformer.

3. The analog to digital conversion apparatus as recited in claim 1 wherein the up-converter conducts the frequency-up-conversion by multiplying the input analog signal by a local signal of which frequency is the same as the sampling frequency of the A/D converter.

4. The analog to digital conversion apparatus as recited in claim 2 wherein the up-converter conducts the frequency-up-conversion by multiplying the input analog signal by a local signal of which frequency is the same as the sampling frequency of the A/D converter.

5. A signal analyzer comprising:
   an analog to digital converter;
   a digital signal processor connected to the analog to digital converter for enabling measurements of a signal under test,
   a low bandpass filter for limiting a band of an input analog signal as satisfying a Nyquist condition defined by a sampling frequency of the analog to digital converter;
   an up-converter for frequency-up-converting an output signal of the low bandpass filter; and
   a transformer receiving an output of the up-converter at the primary winding and for providing the A/D converter with an analog signal induced at the secondary winding wherein the frequency-up-conversion is conducted as an alias arises at the A/D converter corresponds to the output signal of the low bandpass filter.

6. The signal analyzer as recited in claim 5 further comprising:
   a down-converter for frequency-down-converting the input analog signal; and
   a signal selection block for selecting one of the output signals of the up-converter and down-converter to provide it to the transformer.

7. The signal analyzer as recited in claim 5 wherein the up-converter conducts the frequency-up-conversion by multiplying the input analog signal by a local signal of which frequency is the same as the sampling frequency of the A/D converter.

8. The signal analyzer as recited in claim 6 wherein the up-converter conducts the frequency-up-conversion by multiplying the input analog signal by a local signal of which frequency is the same as the sampling frequency of the A/D converter.

* * * * *